(12) United States Patent
Ri et al.

(10) Patent No.: US 10,744,568 B2
(45) Date of Patent: Aug. 18, 2020

(54) COATED TOOL (71) Applicant: Kyocera Corporation, Kyoto-shi, Kyoto (JP)

(72) Inventors: Kou Ri, Satsumasendai (JP); Tsuyoshi Yamasaki, Satsumasendai (JP)

(73) Assignee: Kyocera Corporation, Kyoto-shi, Kyoto (JP)

( * ) Notice: Subject to any disclaimer, the term of this patent is extended or adjusted under 35 U.S.C. 154(b) by 211 days.

(21) Appl. No.: 15/546,784

(22) PCT Filed: Jan. 25, 2016

(86) PCT No.: PCT/JP2016/052015
§ 371 (c)(1),
(2) Date: Jul. 27, 2017

(87) PCT Pub. No.: WO2016/121690
PCT Pub. Date: Aug. 4, 2016

(65) Prior Publication Data
US 2018/0015548 A1    Jan. 18, 2018

(30) Foreign Application Priority Data
Jan. 28, 2015 (JP) .................. 2015-014436

(51) Int. Cl.
*B23B 27/14* (2006.01)
*C23C 16/36* (2006.01)
(Continued)

(52) U.S. Cl.
CPC .......... *B23B 27/146* (2013.01); *B23B 27/148* (2013.01); *C23C 16/30* (2013.01);
(Continued)

(58) Field of Classification Search
USPC .......... 51/307, 309; 428/141, 698, 701, 702
See application file for complete search history.

(56) References Cited

U.S. PATENT DOCUMENTS 5,487,625 A * 1/1996 Ljungberg ............ C23C 16/403
428/698
5,861,210 A * 1/1999 Lenander .............. C23C 16/403
428/701
(Continued)

FOREIGN PATENT DOCUMENTS

JP    H06-316758 A    11/1994
JP    H10-204639 A    8/1998
(Continued)

OTHER PUBLICATIONS

International Search Report (Form PCT/ISA/210) dated Feb. 16, 2016, issued for PCT/JP2016/052015.
(Continued)

*Primary Examiner* — Archene A Turner
(74) *Attorney, Agent, or Firm* — Viering, Jentschura & Partner MBB (57) ABSTRACT A coated tool include a first surface, a second surface which is adjacent to the first surface, and a cutting edge which is located on at least a portion of a ridge between the first surface and the second surface. The coated tool further includes a substrate, and a coating layer that is located on the substrate. The coating layer includes a titanium carbonitride layer and an aluminum oxide layer which has an α-type crystalline structure. The titanium carbonitride layer is located nearer to the substrate than the aluminum oxide layer. When a value represented by the following equation is taken to be an orientation factor Tc(hkl) on the basis of peaks of the aluminum oxide layer analyzed by X-ray diffraction analysis, a ratio (Tcf(104)/Tcf(012)) of orientation factors Tcf(104) to Tcf(012) of the coating layer on the second surface is higher than a ratio (Tcr(104)/Tcr(012)) of orientation factors Tcr(104) and Tcr(012) of the coating layer on
(Continued)

the first surface: $Tc(hkl)=\{I(hkl)/I_0(hkl)\}/[(1/7)\times\Sigma\{I(HKL)/I_0(HKL)\}]$.

8 Claims, 2 Drawing Sheets

(51) Int. Cl.
  *C23C 16/30* (2006.01)
  *C23C 16/34* (2006.01)
  *C23C 16/40* (2006.01)
  *C23C 28/04* (2006.01)
  *C23C 30/00* (2006.01)

(52) U.S. Cl.
  CPC ............ *C23C 16/34* (2013.01); *C23C 16/347* (2013.01); *C23C 16/36* (2013.01); *C23C 16/403* (2013.01); *C23C 16/406* (2013.01); *C23C 28/042* (2013.01); *C23C 28/044* (2013.01); *C23C 30/005* (2013.01); *B23B 2222/88* (2013.01); *B23B 2228/04* (2013.01); *B23B 2228/10* (2013.01)

(56) References Cited

U.S. PATENT DOCUMENTS

| | | | | |
|---|---|---|---|---|
| 6,293,739 | B1* | 9/2001 | Uchino | C23C 30/005 407/119 |
| 6,682,274 | B2* | 1/2004 | Votsch | C23C 30/005 407/119 |
| 7,655,293 | B2* | 2/2010 | Ljungberg | B24C 1/08 428/702 |
| 2008/0260477 | A1* | 10/2008 | Omori | B23B 27/141 407/119 |
| 2008/0298921 | A1* | 12/2008 | Sundstrom | C23C 16/0272 428/336 |
| 2009/0211414 | A1 | 8/2009 | Fukano | |
| 2009/0214857 | A1 | 8/2009 | Itoh et al. | |
| 2012/0225247 | A1* | 9/2012 | Sone | C23C 16/34 428/141 |
| 2014/0173996 | A1* | 6/2014 | Stiens | C23C 16/403 51/309 |
| 2014/0193624 | A1* | 7/2014 | Stiens | C23C 30/005 428/216 |
| 2014/0377024 | A1 | 12/2014 | Sobana et al. | |
| 2015/0003925 | A1* | 1/2015 | Ostlund | C23C 30/005 407/119 |

FOREIGN PATENT DOCUMENTS

| | | |
|---|---|---|
| JP | 2003-025114 A | 1/2003 |
| JP | 2009-202264 A | 9/2009 |
| JP | 4658939 B2 | 1/2011 |
| JP | 4728961 B2 | 4/2011 |
| JP | 2013-132717 A | 7/2013 |

OTHER PUBLICATIONS

Written Opinion (Form PCT/ISA/237) dated Feb. 16, 2016, issued for PCT/JP2016/052015.

* cited by examiner

COATED TOOL

TECHNICAL FIELD

The present disclosure relates to a coated tool which includes a coating layer on the surface of a substrate.

BACKGROUND ART

Known Coated tools include cutting tools in which a single or a plurality of titanium carbide layers, titanium nitride layers, titanium carbonitride layers, aluminum oxide layers, and titanium aluminum nitride layers are formed on the surface of a substrate made from such as cemented carbide alloy, cermet, or ceramic.

In such cutting tools, opportunities for using heavy interrupted machining or the like, in which high impact is applied to the cutting edge, have increased with the recent increased performance of cut processing. Thus, improvements in chipping resistance and wear resistance have come to be demanded in order to suppress peeling of the coating layer or chipping due to the high impact applied to the coating layer under such severe cutting conditions.

As technology that improves chipping resistance in the above cutting tools, Patent Document 1 discloses technology by which a compact aluminum oxide layer having high chipping resistance can be formed by appropriately adjusting the particle size and thickness of the aluminum oxide layer and by setting the texture coefficient (orientation factor) on the (012) plane of the aluminum oxide layer to not less than 1.3.

Patent Document 2 discloses technology by which chipping resistance of an aluminum oxide layer can be improved by enabling easy release of residual stress in the aluminum oxide layer by setting the texture coefficient on the (012) plane of the aluminum oxide layer to not less than 2.5.

Furthermore, as technology that improves wear resistance in the above cutting tool, Patent Document 3 discloses technology by which strength and toughness of a coating film can be improved by forming an aluminum oxide layer located directly above an intermediate layer in the coating film so as to result in lamination of unit layers of two or more layers exhibiting different X-ray diffraction patterns.

Patent Document 4 discloses a cutting tool in which the orientation factor of the (006) plane of an aluminum oxide layer is not less than a high 1.8, and the peak intensity ratio I(104)/I(110) of the (104) plane to the (110) plane is controlled within a prescribed range.

Additionally, Patent Document 5 discloses a cutting tool in which the peak intensity ratio I(104)/I(012) of the (104) plane to the (012) plane of an aluminum oxide layer is greater in a second face than in a first face under the second face in the aluminum oxide layer.

CITATION LIST

Patent Literature

Patent Document 1: JP-B-06-316758
Patent Document 2: JP-A-2003-025114
Patent Document 3: JP-A-10-204639
Patent Document 4: JP-A-2013-132717
Patent Document 5: JP-A-2009-202264

SUMMARY OF INVENTION

The coated tool according to the present embodiment includes a first surface, a second surface adjacent to the first surface, and a cutting edge located on at least a portion of a ridge between the first surface and the second surface. The coated tool further includes a substrate and a coating layer located on the surface of the substrate. The coating layer includes a titanium carbonitride layer and an aluminum oxide layer having an a-type crystalline structure. The titanium carbonitride layer is located nearer to the substrate than the aluminum oxide layer. When a value represented by the following equation is taken to be an orientation factor Tc(hkl) on the basis of peaks of the aluminum oxide layer analyzed by X-ray diffraction analysis, a ratio (Tcf(104)/Tcf(012)) of orientation factors Tcf(104) to Tcf(012) of the coating layer on the second surface is higher than a ratio (Tcr(104)/Tcr(012)) of orientation factors Tcr(104) to Tcr(012) of the coating layer on the first surface:

$$Tc(hkl) = \{I(hkl)/I_0(hkl)\} / [(1/7) \times \Sigma \{I(HKL)/I_0(HKL)\}].$$

Here, (HKL) represents (012), (104), (110), (006), (113), (024), and (116) crystal planes. Each of I(HKL) and I(hkl) represents a peak intensity of a peak attributed to respective crystal planes detected in X-ray diffraction analysis of the aluminum oxide layer. Each of $I_0$(HKL) and $I_0$(hkl) represents a standard diffraction intensity of respective crystal planes listed on JCPDS card no. 43-1484.

BRIEF DESCRIPTION OF DRAWINGS

FIGS. 4A and 4B illustrate an example of the method for setting the substrate in the deposition apparatus, which forms the coating layer.

DESCRIPTION OF EMBODIMENTS

A coated tool of the present disclosure will be described in detail.

Figure 1:
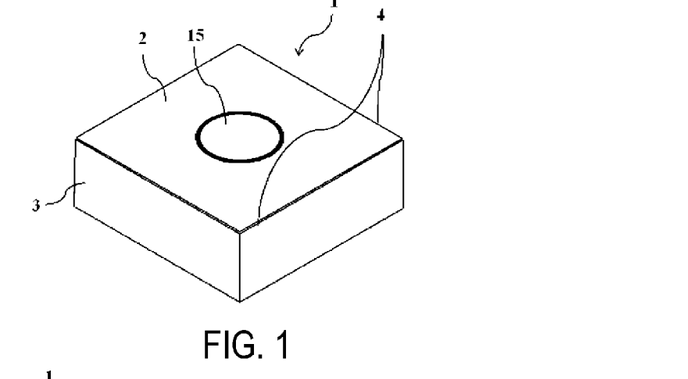
FIG. 1 is a schematic perspective view of a cutting tool, which is an example of a coated tool according to the present embodiment.

In an embodiment of the present disclosure, a cutting tool (abbreviated simply as "tool" hereinafter) includes a first surface 2, a second surface 3 adjacent to the first surface 2, and a cutting edge 4 located on a ridge between the first surface 2 and the second surface 3. In the present embodiment, the tool 1 is a polyhedron wherein the first surface 2 is a rake face 2 and the second surface 3 is a flank face, as illustrated in FIG. 1. Hereinafter, the first surface 2 will be referred to as rake face 2, and the second surface 3 will be referred to as flank face 3. Note that a screw hole 15 is present in the center of the rake face 2 of the tool 1 illustrated in FIG. 1, but the screw hole 15 is not necessarily required.

Figure 2:
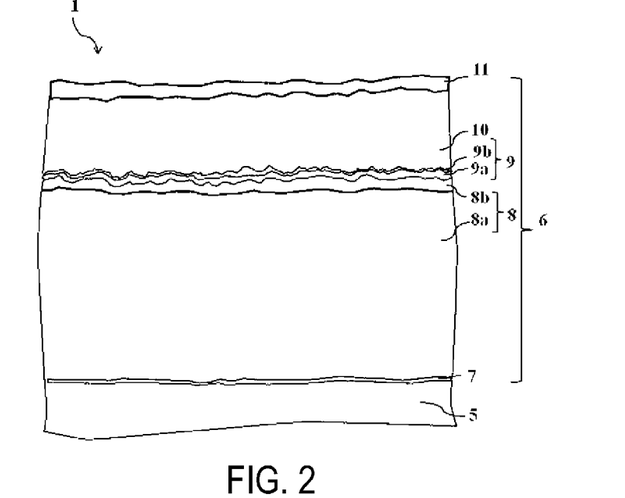
FIG. 2 is a schematic cross-sectional view of the cutting tool illustrated in FIG. 1.

Furthermore, as illustrated in FIG. 2, the tool 1 further includes a substrate 5 and a coating layer 6 provided on the surface of this substrate 5.

The coating layer 6 includes a bottom layer 7, a titanium carbonitride layer 8, an intermediate layer 9, an aluminum oxide layer 10, and a surface layer 11. The bottom layer 7, titanium carbonitride layer 8, intermediate layer 9, aluminum oxide layer 10, and surface layer 11 are laminated in that order from the substrate 5 side. The aluminum oxide layer 10 has an α-type crystalline structure.

The rake face 2, flank face 3, and cutting edge 4 can each be an outermost surface of the tool 1. That is, when the outermost surface of the tool 1 is the coating layer 6 as in the present embodiment, the rake face 2, the flank face 3, and the cutting edge 4 can be surfaces of the coating layer 6. When the coating layer 6 has been worn, the rake face 2, flank face 3, and cutting edge 4 can be worn surfaces of the coating layer 6. When the coating layer 6 wears out and the substrate 5 has exposed, the outermost surface of the tool 1 is the substrate 5, and thus the rake face 2, flank face 3, and cutting edge 4 can each be the surface of the exposed substrate 5.

In the present embodiment, the value represented by the following equation is defined as the orientation factor Tc(hkl) at the peaks of the aluminum oxide layer 10 analyzed by X-ray diffraction analysis:

$$Tc(hkl) = \{I(hkl)/I_0(hkl)\}/[(1/7) \times \Sigma\{I(HKL)/I_0(HKL)\}].$$

Here, (HKL) represents (012), (104), (110), (006), (113), (024), and (116) crystal planes, and each of I(HKL) and I(hkl) represents a peak intensity of a peak attributed to respective crystal planes detected in X-ray diffraction analysis of the aluminum oxide layer 10. Each of $I_0$(HKL) and $I_0$(hkl) represents a standard diffraction intensity of respective crystal planes listed on Joint Committee on Powder Diffraction Standards (JCPDS) card no. 43-1484.

The orientation factor on the flank face 3 side can be defined as Tcf, and the orientation factor on the rake face 2 side can be defined as Tcr. Note that the orientation factor Tc is defined as a ratio obtained using unoriented standard data set forth on a JCPDS card, and thus is an index expressing the degree of orientation of each of the crystal planes. Furthermore, the "(hkl)" of Tc(hkl) represents the crystal plane for which the orientation factor is calculated.

According to the present embodiment, the ratio (Tcf(104)/Tcf(012)) of orientation factors Tcf(104) to Tcf(012) is higher than the ratio (Tcr(104)/Tcr(012)) of orientation factors Tcr(104) to Tcr(012). As a result, on the rake face 2, chipping resistance of the aluminum oxide layer 10 is enhanced and progression of crater wear accompanying peeling of the aluminum oxide layer 10 is reduced. On the flank face 3, wear resistance of the aluminum oxide layer 10 is enhanced and flank face wear is decreased. That is, in the present embodiment, crater wear caused by chipping and peeling of the coating layer due to collision of chips, does not tend to progress. As such, the coating layer 6 on the rake face 2 has high chipping resistance. On the other hand, since the wear resistance of the coating layer 6 on the flank face 3 is high, progression of flank face wear due to contact with workpiece can be reduced.

In the above embodiment, Tcf(104) is higher than Tcf(012), and Tcr(104) is lower than Tcr(012). Thus, wear resistance on the flank face 3 can be further enhanced. As a result, a coated tool that enables long-term use can be provided.

The coated tool of the present embodiment satisfies both of the following conditions 1 and 2.

Condition 1: Among the peaks on the flank face 3 on an X-ray diffraction chart, a peak intensity If(006) of a peak attributed to the (006) plane or a peak intensity If(104) of a peak attributed to the (104) plane is the highest.

Condition 2: Among the peaks on the rake face 2 on an X-ray diffraction chart, a peak intensity Ir(006) of a peak attributed to the (006) plane or a peak intensity Ir(012) of a peak attributed to the (012) plane is the highest.

Due to satisfying both of the conditions 1 and 2, wear resistance on the flank face 3 can be further enhanced.

The method for measuring Tcr(hkl) and Tcf(hkl) of the aluminum oxide layer 10 will be described. X-ray diffraction analysis of the aluminum oxide layer 10 is performed using a general X-ray diffraction analysis apparatus that uses a CuKα beam. The regions measured are a 3 mmφ region in the center of a flat surface of the rake face 2 and a 3 mmφ region in the center of the flank face 3. In determining the peak intensities of each of the crystal planes of the aluminum oxide layer 10 from an X-ray diffraction chart, the diffraction angle of each of the crystal planes listed on JCPDS card no. 43-1484 is checked, the crystal planes of the detected peaks are identified, and the peak intensities thereof are measured.

Note that peaks detected in X-ray diffraction analysis are identified using JCPDS cards, but the position of a peak may deviate due to residual stress and the like present in the coating layer 6. For this reason, to determine whether or not the detected peak is a peak of the aluminum oxide layer 10, X-ray diffraction analysis is performed for an aluminum oxide layer 10 that is exposed after the coating layer 6 has been ground, and the peaks detected before and after grinding are compared. A peak can be confirmed to be that of the aluminum oxide layer 10 according to this difference obtained by comparison.

For Tcr(hkl) and Tcf(hkl), the surface peaks are measured from the surface of the aluminum oxide layer 10. Specifically, the peak intensity of the aluminum oxide layer 10 is measured in the region from the surface of the aluminum oxide layer 10 on the rake face 2 side to the surface of the aluminum oxide layer 10 on the substrate 5 side. Even if a surface layer 11 is present, measurement is basically performed by X-ray diffraction analysis in a state where the surface layer 11 has not been ground. If the surface peaks of the aluminum oxide layer 10 cannot be detected due to the presence of the surface layer 11, X-ray diffraction analysis is performed after exposing the aluminum oxide layer 10. For each of the obtained peaks, the aluminum oxide peaks are identified using JCPDS cards. The intensity of each peak of aluminum oxide is measured, and the orientation factor Tcl(hkl) is calculated. Furthermore, when removing the surface layer 11 by grinding, the aluminum oxide layer 10 may be removed up to 20% of the thickness of the layer 10. X-ray diffraction analysis may be performed for the surface layer 11 that has not been ground if the seven peaks (012), (104), (110), (006), (113), (024) and (116) of aluminum oxide can be measured.

When the thickness of the aluminum oxide layer 10 is from 2 to 9 μm, the aluminum oxide layer 10 has good wear resistance and chipping resistance.

The titanium carbonitride layer 8 includes a so-called moderate temperature (MT)-titanium carbonitride layer 8a and a high temperature (HT)-titanium carbonitride layer 8b. The MT-titanium carbonitride layer 8a and HT-titanium carbonitride layer 8b are laminated in that order from the substrate side. The MT-titanium carbonitride layer 8a is made of columnar crystals that was formed at a relatively low temperature of 780 to 900° C. with acetonitrile ($CH_3CN$) gas as a raw material. The HT-titanium carbonitride layer 8b is made of granular crystals that was formed at a high temperature of 950 to 1100° C. According to the present embodiment, protrusions having a triangle shape in cross-sectional view with narrowing toward the aluminum oxide layer 10 are formed on the surface of the HT-titanium carbonitride layer 8b. This increases the adhesion force of the aluminum oxide layer 10 and decreases peeling and chipping of the coating layer 6. If the thickness of the titanium carbonitride layer 8 is from 6.0 to 13.0 μm, the tool 1 has high wear resistance and chipping resistance.

Furthermore, according to the present embodiment, an intermediate layer 9 is disposed on the surface of the HT-titanium carbonitride layer 8b. The intermediate layer 9 is made of a compound containing titanium and oxygen. Examples of this compound include TiAlCNO, TiCNO, or the like. The intermediate layer 9 illustrated in FIG. 2 has a two-layer structure which is composed of a lower intermediate layer 9a and an upper intermediate layer 9b. The intermediate layer 9 causes the aluminum oxide grains in the aluminum oxide layer 10 to have an a-type crystalline structure. The aluminum oxide layer 10 made of an α-type crystalline structure has high hardness and can increase the wear resistance of the coating layer 6. The intermediate layer 9 has a laminate structure of a lower intermediate layer 9a made from TiAlCNO and an upper intermediate layer 9b made from TiCNO. Such a structure increases the chipping resistance of the cutting tool 1. Note that the intermediate layer 9 may also be a single layer or may be three or more layers. If the thickness of the intermediate layer 9 is from 0.05 to 0.5 μm, the adhesiveness of the aluminum oxide layer 10 is high.

Additionally, the bottom layer 7 and the surface layer 11 are made from titanium nitride. Note that in other embodiments, at least one of the bottom layer 7 and the surface layer 11 may be omitted. Furthermore, the bottom layer 7 can be set to a thickness of 0.1 to 1.0 μm, and a thickness of the surface layer 11 can be set to 0.1 to 3.0 μm.

The thickness of each layer and the properties of the crystals that constitute each layer may be measured by observing an electron microscope image (scanning electron microscope (SEM) image or transmission electron microscope (TEM) image) of a cross-section of the tool 1. In the present embodiment, the crystal form of the crystals in each layer of the coating layer 6 being columnar indicates a ratio of the average crystal width to the length of each crystal in the direction of thickness of the coating layer 6 being not greater than 0.3 on average. On the other hand, when the ratio of the average crystal width to the length of each crystal in the direction of thickness of the coating layer is greater than 0.3, it is defined as a granular crystal form.

Meanwhile, the material of the substrate 5 of the tool 1 includes cemented carbide alloy, cermet, ceramic, or metal. The cemented carbide alloy may be a material in which a hard phase made from tungsten carbide (WC) and, as requested, at least one type selected from the group consisting of carbides, nitrides, and carbonitrides of a metal of group 4, 5, or 6 of the periodic table other than tungsten carbide are bonded by a bonding phase made from an iron group metal such as cobalt (Co) or nickel (Ni). The cermet may be a material in which a hard phase made from titanium carbonitride (TiCN) and, as requested, at least one type selected from the group consisting of carbides, nitrides, and carbonitrides of a metal of group 4, 5, or 6 of the periodic table other than titanium carbonitride are bonded by a bonding phase made from an iron group metal such as cobalt (Co) or nickel (Ni). The ceramic may be $Si_3N_4$, $Al_2O_3$, diamond, cubic boron nitride (cBN), or the like. The metal may be carbon steel, high-speed steel, alloy steel, or the like. From the perspectives of chipping resistance and wear resistance, the substrate 5 is preferably made from cemented carbide alloy or cermet.

Figure 3:
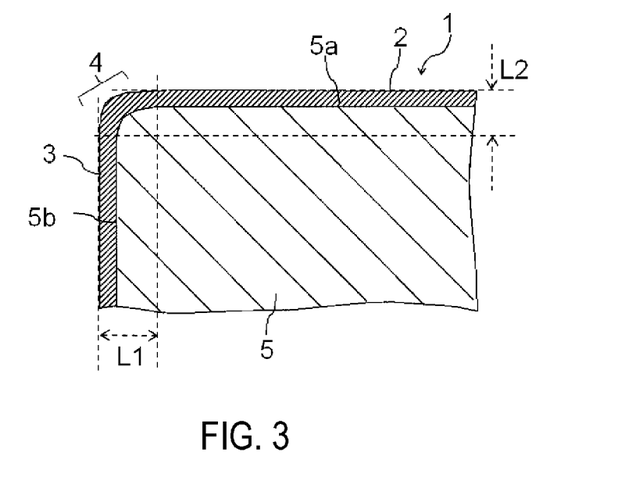
FIG. 3 is a partial cross-sectional view of the tool 1 illustrated in FIG. 1.

In the present embodiment, the cutting edge 4 has a curved surface shape. Note that FIG. 3 is a partial cross-sectional view of the tool 1 illustrated in FIG. 1, thus the cutting edge 4 has a curvilinear shape in FIG. 3. As a result, chipping and damage of the cutting edge 4 can be decreased. Furthermore, if the ratio (L1/L2) of the width L1 of the curved surface when the rake face 2 is viewed head-on to the width L2 of the curved surface when the flank face 3 is viewed head-on is from 1.3 to 2.0 as illustrated in FIG. 3, the sharpness and chipping resistance of the cutting edge 4 can be further increased. Note that the cutting edge 4 can be made into a curved surface shape by honing.

If the width L2 of the curved surface when the flank face 3 is viewed head-on is from 0.030 to 0.080 mm, the wear resistance and the chipping resistance of the cutting edge 4 can be further increased.

Additionally, among the surfaces of the substrate 5, if the interface roughness of the surface 5a corresponding to the rake face 2 is smaller than the interface roughness of the surface 5b corresponding to the flank face 3, chips flow smoothly over the rake face 2, and the orientation of the aluminum oxide particles in the aluminum oxide layer 10 can be easily controlled. Interface roughness in the present embodiment indicates the value calculated based on the method of calculating ten-point mean roughness (Rz) set forth in JIS B0601-2001 of the Japanese Industrial Standards (JIS) for the interface line between the substrate and the coating layer of the mirror-finished tool, which is observed using a scanning electron microscope. In the present embodiment, the length of the interface line used in calculating ten-point mean roughness (Rz) can be 40 μm.

A cutting tool like the above tool 1 is used for cut processing by means of the cutting edge 4 formed on at least a portion of the ridge between the rake face 2 and the flank face 3 impinging on the workpiece, and can exhibit the superior effects described above. The coated tool may also be used in various applications other than a cutting tool, such as excavation tools and cutlery. It has superior mechanical reliability in these cases as well.

Next, the manufacturing method of the coated tool according to the present disclosure will be described with reference to an example of a manufacturing method of the tool 1.

Step 1. Production of the Substrate 5

First, metal powder, carbon powder, a binder, and the like are added to an inorganic powder as appropriate, and they are mixed to produce a mixture. Examples of the inorganic powder include metal carbides, nitrides, carbonitrides, oxides, and the like, which can be formed by firing hard metal alloys. Examples of the metal powder include cobalt powder. Then, a powder compact is produced by molding the mixture using a known molding method. In the present embodiment, since the tool 1 has a screw hole 15, the powder compact includes a hole corresponding to the screw hole 15. Examples of the molding method include press molding, cast molding, extrusion molding, and cold isostatic pressing. After the powder compact undergoes binder removal treatment as requested, a substrate 5 is produced by firing it in vacuum or in a non-oxidizing atmosphere. Then, grinding processing or honing processing of the cutting edge portion is performed as requested on the surface of the substrate 5.

Step 2. Deposition of the Coating Layer 6 on the Surface of the Substrate 5

Figure 4A:
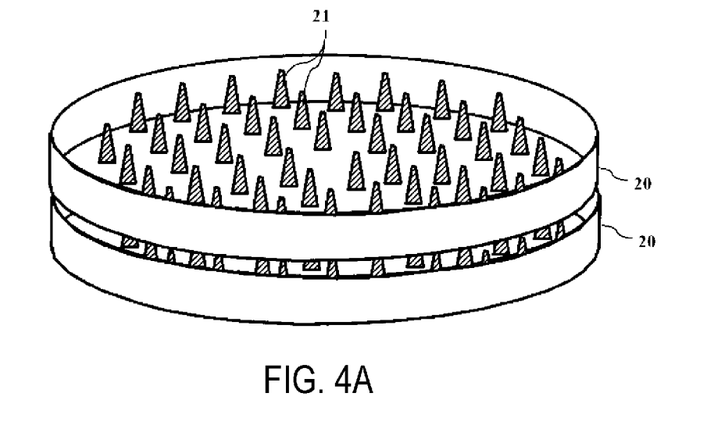
FIG. 4A is a schematic view in which setting jigs have been stacked in a plurality of levels.
Figure 4B:
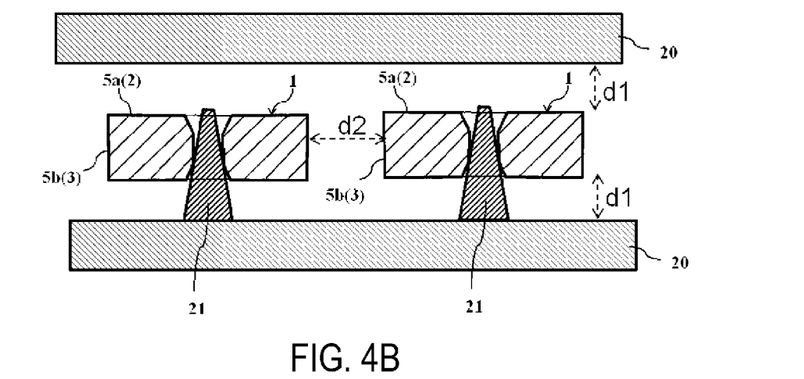
FIG. 4B is a cross-sectional view for explaining the disposition of substrates.

In the present embodiment, the coating layer 6 is formed by chemical vapor deposition (CVD). FIG. 4 illustrates an example of the method for setting the substrate 5 in the deposition apparatus which forms the coating layer 6. FIG. 4A is a schematic view in which setting jigs 20 have been stacked in a plurality of levels, and FIG. 4B is a cross-sectional view for explaining the disposition of substrates 5. To set the substrates 5, setting jigs 20 in which support rods have been disposed with prescribed gaps therebetween are prepared according to the setting method of FIG. 4. The substrates 5 are each held by a support rod 21 via a screw hole 15 in the center of each of the substrates 5. Then, the setting jigs 20 are stacked in a plurality of levels. When a plurality of substrates 5 are set in the setting jigs 20, the gap between the substrates 5 and the gap between each substrate 5 and setting jig 20 are adjusted. Specifically, the gap d1 between the substrate 5a serving as the rake face 2 and the setting jig 20 is adjusted so as to be smaller than the gap d2 between substrates 5b serving as flank faces 3. More specifically, the gap between the rake faces 2 is adjusted to not greater than 0.7 times the diameter L of the inscribed circle of the rake face 2 (the greatest circle drawn inside the rake face 2), and the gap between the flank faces 3 is greater than 0.7 times the diameter L. This controls the crystal orientation of the aluminum oxide layer 10 on the rake face 2 and the flank face 3.

Figure 5:
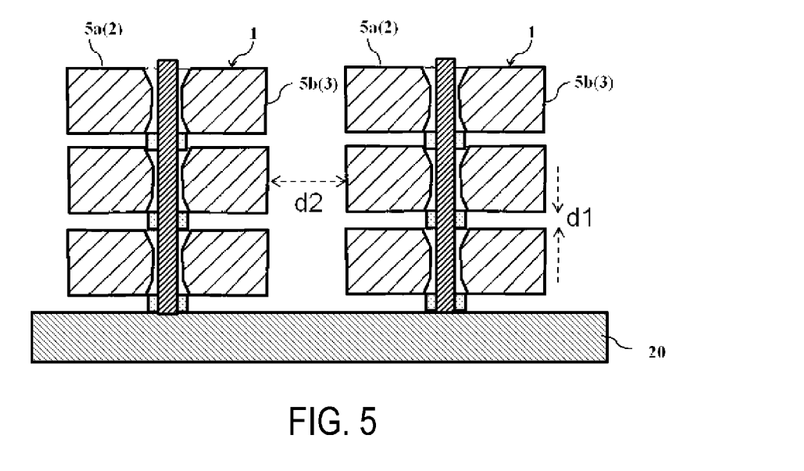
FIG. 5 is a cross-sectional view for explaining the disposition of substrates, which is another example of the method for setting the substrates in the deposition apparatus, which forms the coating layer.

FIG. 5 illustrates another example of the method for setting the substrate 5 in the deposition apparatus which forms the coating layer 6. FIG. 5 is a cross-sectional view for explaining the disposition of substrates 5. The setting method illustrated in FIG. 5 is a method in which substrates 5 have been skewered on support rods with prescribed gaps by repeatedly inserting support rods into the screw holes 15 of substrates 5, then into a spacer, and then into other substrates 5. In this case, the gap d1 between the surfaces of the substrates 5a is best adjusted so as to be smaller than the gap d2 between the surfaces of the substrates 5b.

In the present embodiment, the coating layer 6 is formed by depositing the bottom layer 7, titanium carbonitride layer 8, intermediate layer 9, aluminum oxide layer 10, and surface layer 11 in that order.

As for the deposition conditions of the bottom layer 7, a reaction gas includes from 0.5 to 10 vol. % of titanium tetrachloride ($TiCl_4$) gas, from 10 to 60 vol. % of nitrogen ($N_2$) gas, and the balance hydrogen ($H_2$) gas, a deposition temperature is from 800 to 940° C., and a gas pressure is from 8 to 50 kPa.

The titanium carbonitride layer 8 is formed as follows: first an MT-titanium carbonitride layer 8a is formed, and then an HT-titanium carbonitride layer 8b is formed. As for the deposition conditions of the MT-titanium carbonitride layer 8a, a reaction gas includes from 0.5 to 10 vol. % of titanium tetrachloride ($TiCl_4$) gas, from 5 to 60 vol. % of nitrogen ($N_2$) gas, from 0.1 to 3.0 vol. % of acetonitrile ($CH_3CN$) gas, and the balance hydrogen ($H_2$) gas, a deposition temperature is from 780 to 880° C., and a gas pressure is from 5 to 25 kPa. Setting the content ratio of acetonitrile ($CH_3CN$) gas to a higher value in the later stage of film deposition than in the initial stage enables formation of a structure in which the average crystal width of the columnar crystals of titanium carbonitride constituting the MT-titanium carbonitride layer 8a is greater at the surface side than on the substrate 5 side.

As for the deposition conditions of the HT-titanium carbonitride layer 8b, a reaction gas includes from 1 to 4 vol. % of titanium tetrachloride ($TiCl_4$) gas, from 5 to 20 vol. % of nitrogen ($N_2$) gas, from 0.1 to 10 vol. % of methane ($CH_4$) gas, and the balance hydrogen ($H_2$) gas, a deposition temperature is from 900 to 1050° C., and a gas pressure is from 5 to 40 kPa.

As the deposition conditions of the first stage of the intermediate layer 9, a reaction gas includes from 3 to 30 vol. % of titanium tetrachloride ($TiCl_4$) gas, from 3 to 15 vo. % of methane ($CH_4$) gas, from 5 to 10 vol. % of nitrogen ($N_2$) gas, from 0.5 to 1 vol. % of carbon monoxide (CO) gas, from 0.5 to 3 vol. % of aluminum trichloride ($AlCl_3$) gas, and the balance hydrogen ($H_2$) gas, a deposition temperature is from 900 to 1050° C., and a gas pressure is from 5 to 40 kPa. In this step, a textured intermediate layer 9 is formed on the surface of the titanium carbonitride layer 8.

As for the deposition conditions of the second stage of the intermediate layer 9, a reaction gas includes from 3 to 15 vol. % of titanium tetrachloride ($TiCl_4$) gas, from 3 to 10 vol. % of methane ($CH_4$) gas, from 10 to 25 vol. % of nitrogen ($N_2$) gas, from 1 to 5 vol. % of carbon monoxide (CO) gas, and the balance hydrogen ($H_2$) gas, a deposition temperature is from 900 to 1050° C., and a gas pressure is from 5 to 40 kPa. In this step, the nitrogen ($N_2$) gas may be changed to argon (Ar) gas. By this step, the texturing on the surface of the intermediate layer 9 becomes fine, and the growth of aluminum oxide crystals in the subsequently formed aluminum oxide layer 10 can be adjusted.

As for the deposition conditions of the aluminum oxide layer 10, a mixed gas includes from 0.5 to 5.0 vol. % of aluminum trichloride ($AlCl_3$) gas, from 1.5 to 5.0 vol. % of hydrogen chloride (HCl) gas, from 0.5 to 5.0 vol. % of carbon dioxide ($CO_2$) gas, from 0 to 1.0 vol. % of hydrogen sulfide ($H_2S$) gas, and the balance hydrogen ($H_2$) gas, a deposition temperature is from 950 to 1100° C., and a gas pressure is from 5 to 20 kPa.

As for the deposition conditions of the surface layer 11 made from TiN, a reaction gas includes from 0.1 to 10 vol. % of titanium tetrachloride ($TiCl_4$) gas, from 10 to 60 vol. % of nitrogen ($N_2$) gas, and the balance hydrogen ($H_2$) gas, a deposition temperature is from 960 to 1100° C., and a gas pressure is from 10 to 85 kPa.

Step 3. Grind of the Surface of the Formed Coating Layer 6 Corresponding to the Cutting Edge 4

The cutting edge 4 is processed smoothly by this grinding, resulting in a tool with less welding of workpiece and enhanced chipping resistance. Examples of the grinding method include brushing, blasting, and grinding using an elastic grindstone.

EXAMPLES

First, a mixture was prepared by mixing 6 mass % of metal cobalt powder having an average particle size of 1.2 µm, 0.5 mass % of titanium carbide powder having an average particle size of 2.0 µm, 2.0 mass % of niobium carbide powder having an average particle size of 2.0 µm, and the remainder tungsten carbide having an average particle size of 1.5 µm. This mixture was then molded into a tool shape (CNMG120408) by press molding. Then, the molded body was subjected to binder removal treatment, and fired for 1 hour at 1500° C. under vacuum of 0.01 Pa, to produce a substrate made from cemented carbide alloy. Subsequently, the produced substrate underwent brush processing, and R honing was performed on the portion thereof serving as the cutting edge.

Then, a coating layer was deposited on the above cemented carbide alloy substrate by chemical vapor deposition (CVD) under the deposition conditions shown in Table 1, to produce a cutting tool. In Tables 1 and 2, each of the compounds is expressed as chemical symbols. When forming the coating layer, the substrate was disposed such that the gap between the setting jig and the main face of the substrate which corresponds to the rake face of the tool and has an inscribed circle diameter L=12.7 mm, and the gap between the side faces (flank faces) corresponding to the flank faces of the tool, were as shown in Table 2.

X-ray diffraction analysis was performed on the above sample using a CuKα beam. The peaks measured from the surface of the aluminum oxide layer were identified, and the peak intensity of each peak was measured. The measurement locations selected for X-ray diffraction analysis were a flat surface in the center of the surface of the coating layer 6 on the rake face 2 and a flat surface in the center of the coating layer surface on the flank face 3. For this X-ray diffraction data, the peaks of highest intensity were confirmed, and orientation factors Tcf(104), Tcf(012), Tcr(104), and Tcr(012) were calculated. The above X-ray diffraction measurement was performed for three arbitrary samples, and the average value thereof was used in evaluation. Furthermore, a mirror-finished cross-section of the tool was observed by scanning electron microscope (SEM), and the thickness of each layer was measured. Results are shown in Tables 2 and 3. Additionally, interface roughness Rz at the interface line between the substrate and the coating layer of the mirror-finished tool was estimated using a scanning electron microscope. In this estimation, interface roughness Rz was measured on an interface line 40 μm long using a SEM image at 3000× magnification. Additionally, the width L1 of the curved surface when the rake face was viewed head-on and the width L2 of the curved surface when the flank face was viewed head-on were measured using a projector, and the ratio thereof (L1/L2) was calculated.

Then, a continuous cutting test and an intermittent cutting test were performed under the following conditions using the obtained cutting tool, and wear resistance and chipping resistance were evaluated. Results are shown in Table 4.

(Continuous Cutting Conditions)
Workpiece: Chromium molybdenum steel (SCM435)
Tool shape: CNMG120408
Cutting speed: 300 m/min
Feed speed: 0.3 mm/rev
Depth of cut: 1.5 mm
Cutting time: 25 min
Other: Water-soluble cutting fluid was used
Evaluated item: The honed portion of the tip of the cutting edge was observed by scanning electron microscope, and in the portions that had actually worn, the flank face wear width was measured.

(Intermittent Cutting Conditions)
Workpiece: Chromium molybdenum steel with four grooves inserted (SCM440)
Tool shape: CNMG120408
Cutting speed: 300 m/min
Feed speed: 0.3 mm/rev
Depth of cut: 1.5 mm
Other: Water-soluble cutting fluid was used
Evaluated item: The number of times impacted until chipping was measured.

TABLE 1

| Coating layer | Mixed gas composition (vol. %) | Furnace temperature (° C.) | Pressure (kPa) |
|---|---|---|---|
| TiN-1 | $TiCl_4$: 2.5, $N_2$: 23, $H_2$: balance | 900 | 16 |
| TiCN-1(MT) | $TiCl_4$: 1.0, $N_2$: 10, $CH_3CN$: 0.1 → 0.4, $H_2$: balance | 850 | 9 |
| TiCN-2(HT) | $TiCl_4$: 1.0, $N_2$: 10, $CH_4$: 2.0, $H_2$: balance | 1010 | 9 |
| TiAlCNO-1 | $TiCl_4$: 7.0, $CH_4$: 5.5, $N_2$: 5.0, CO: 0.5, $AlCl_3$: 1.5, $H_2$: balance | 1000 | 15 |
| TiCNO-1 | $TiCl_4$: 7.0, $CH_4$: 3.5, $N_2$: 15.0, CO: 3.0, $H_2$: balance | 1000 | 15 |
| $Al_2O_3$-1 | $AlCl_3$: 2.5 → 5.0, HCl: 2.0 → 0.7, $CO_2$: 1.3, $H_2S$: 0.1, $H_2$: balance | 1000 | 10 |
| $Al_2O_3$-2 | $AlCl_3$: 1.5, HCl: 5.0, $CO_2$: 1.0, $H_2$: balance | 1005 | 6 |
| TiN-2 | $TiCl_4$: 2.0, $N_2$: 44, $H_2$: balance | 1010 | 80 |

TiCN-1(MT): The $CH_3CN$ content in the mixed gas was continuously varied from 0.1 to 0.4 vol. %.
$Al_2O_3$-1 The added amount of each of the gases ($AlCl_3$, $CO_2$, $H_2S$) in the mixed gas was continuously varied from x to y.

TABLE 2

| Sample No. | Substrate disposition Gap (mm) Rake face | Gap (mm) Flank face | Coating layer[Note 1] Bottom layer | TiCN layer | | Intermediate layer | | $Al_2O_3$ layer | Surface layer |
|---|---|---|---|---|---|---|---|---|---|
| 1 | 0.55 | 0.82 | TiN-1 (1) | TiCN-1 (8) | TiCN-2 (0.3) | — | TiCNO-1 (0.1) | $Al_2O_3$-2 (7) | TiN-2 (1.0) |
| 2 | 0.55 | 0.79 | TiN-1 (1) | TiCN-1 (8) | TiCN-2 (0.3) | TiAlCNO-1 (0.1) | TiCNO-1 (0.1) | $Al_2O_3$-2 (7) | — |
| 3 | 0.55 | 0.87 | TiN-1 (1) | TiCN-1 (8) | TiCN-2 (0.3) | TiAlCNO-1 (0.1) | TiCNO-1 (0.1) | $Al_2O_3$-1 (6) | TiN-2 (1.0) |
| 4 | 0.55 | 1.18 | TiN-1 (0.5) | TiCN-1 (9) | TiCN-2 (0.5) | TiAlCNO-1 (0.1) | TiCNO-1 (0.1) | $Al_2O_3$-2 (4) | TiN-2 (2.0) |
| 5 | 0.55 | 0.79 | TiN-1 (0.5) | TiCN-1 (12) | TiCN-2 (0.1) | TiAlCNO-1 (0.05) | TiCNO-1 (0.05) | $Al_2O_3$-1 (3) | TiN-2 (1.5) |
| 6 | 0.55 | 1.18 | — | TiCN-1 (9) | TiCN-2 (0.2) | TiAlCNO-1 (0.2) | TiCNO-1 (0.1) | $Al_2O_3$-1 (6) | TiN-2 (1.0) |
| 7 | 0.55 | 0.79 | TiN-1 (0.5) | TiCN-1 (6) | TiCN-2 (0.5) | — | TiCNO-1 (0.5) | $Al_2O_3$-2 (6) | TiN-2 (3) |
| 8 | 0.63 | 0.87 | — | TiCN-1 (12) | TiCN-2 (0.2) | TiAlCNO-1 (0.2) | TiCNO-1 (0.1) | $Al_2O_3$-1 (3) | TiN-2 (1.0) |

TABLE 2-continued

| | Substrate disposition | | Coating layer[Note 1] | | | | | |
|---|---|---|---|---|---|---|---|---|
| Sample | Gap (mm) | | Bottom | | | | Al$_2$O$_3$ | Surface |
| No. | Rake face | Flank face | layer | TiCN layer | | Intermediate layer | | layer |
| 9 | 0.55 | 0.79 | TiN-1 (1) | TiCN-1 (8) | TiCN-2 (0.3) | TiAlCNO-1 (0.1) | TiCNO-1 (0.1) | Al$_2$O$_3$-2 (7) | TiN-2 (1.0) |
| 10 | 0.55 | 0.79 | TiN-1 (1) | TiCN-1 (8) | TiCN-2 (0.3) | TiAlCNO-1 (0.1) | TiCNO-1 (0.1) | Al$_2$O$_3$-2 (7) | TiN-2 (1.0) |
| 11 | 0.55 | 0.87 | TiN-1 (1) | TiCN-1 (8) | TiCN-2 (0.3) | TiAlCNO-1 (0.1) | TiCNO-1 (0.1) | Al$_2$O$_3$-1 (6) | TiN-2 (1.0) |
| 12 | 0.55 | 0.87 | TiN-1 (1) | TiCN-1 (8) | TiCN-2 (0.3) | TiAlCNO-1 (0.1) | TiCNO-1 (0.1) | Al$_2$O$_3$-1 (2) | TiN-2 (1.0) |
| 13 | 0.55 | 0.87 | TiN-1 (1) | TiCN-1 (8) | TiCN-2 (0.3) | TiAlCNO-1 (0.1) | TiCNO-1 (0.1) | Al$_2$O$_3$-1 (9) | TiN-2 (1.0) |
| 14 | 0.55 | 0.55 | TiN-1 (1) | TiCN-1 (6) | TiCN-2 (0.5) | TiAlCNO-1 (0.1) | TiCNO-1 (0.1) | Al$_2$O$_3$-1 (7) | TiN-2 (1) |
| 15 | 1.18 | 0.55 | TiN-1 (0.5) | TiCN-1 (9) | TiCN-2 (0.1) | TiAlCNO-1 (0.1) | TiCNO-1 (0.1) | Al$_2$O$_3$-1 (5) | TiN-2 (0.5) |
| 16 | 0.79 | 0.71 | TiN-1 (0.5) | TiCN-1 (10) | TiCN-2 (0.3) | TiAlCNO-1 (0.1) | TiCNO-1 (0.1) | Al$_2$O$_3$-2 (4) | TiN-2 (2.0) |

[Note 1] Thickness of layer is shown in parentheses (units: μm).

TABLE 3

| | XRD data of Al$_2$O$_3$ layer | | | | | | | |
|---|---|---|---|---|---|---|---|---|
| | Peak intensity of Al$_2$O$_3$ layer | | | | | | | |
| Sample No. | If maximum peak | Ir maximum peak | Orientation factor Tc | | | | Tcf(104)/ Tcf(012) | Tcr(104)/ Tcr(012) |
| | | | Tcf(104) | Tcf(012) | Tcr(104) | Tcr(012) | | |
| 1 | (104) | (006) | 0.25 | 0.12 | 0.04 | 0.05 | 2.08 | 0.80 |
| 2 | (006) | (006) | 0.03 | 0.02 | 0.02 | 0.03 | 1.50 | 0.67 |
| 3 | (006) | (006) | 0.09 | 0.05 | 0.06 | 0.11 | 1.80 | 0.55 |
| 4 | (104) | (012) | 0.36 | 0.29 | 0.14 | 0.62 | 1.24 | 0.23 |
| 5 | (104) | (012) | 0.25 | 0.23 | 0.07 | 0.35 | 1.09 | 0.20 |
| 6 | (104) | (012) | 0.39 | 0.34 | 0.23 | 0.29 | 1.15 | 0.79 |
| 7 | (110) | (110) | 0.19 | 0.16 | 0.42 | 0.67 | 1.19 | 0.63 |
| 8 | (116) | (116) | 0.14 | 0.15 | 0.14 | 0.27 | 0.93 | 0.52 |
| 9 | (110) | (110) | 0.20 | 0.18 | 0.22 | 0.27 | 1.11 | 0.81 |
| 10 | (331) | (104) | 0.13 | 0.14 | 0.18 | 0.27 | 0.93 | 0.67 |
| 11 | (006) | (006) | 0.09 | 0.05 | 0.06 | 0.11 | 1.80 | 0.55 |
| 12 | (006) | (006) | 0.09 | 0.05 | 0.06 | 0.11 | 1.80 | 0.55 |
| 13 | (006) | (006) | 0.09 | 0.05 | 0.06 | 0.11 | 1.80 | 0.55 |
| 14 | (104) | (104) | 0.11 | 0.09 | 0.11 | 0.09 | 1.22 | 1.22 |
| 15 | (104) | (104) | 0.55 | 0.67 | 0.45 | 0.46 | 0.82 | 0.98 |
| 16 | (012) | (012) | 0.12 | 0.21 | 0.11 | 0.17 | 0.57 | 0.65 |

TABLE 4

| | Interface roughness (μm) | | Honing (mm) | | | Cutting performance | |
|---|---|---|---|---|---|---|---|
| Sample No. | Rake face | Flank face | Rake face side L1 | Flank face side L2 | L1/L2 | Flank face wear width Vb (mm) | Number of times impacted (times) |
| 1 | 0.32 | 0.45 | 0.082 | 0.048 | 1.71 | 0.09 | 3700 |
| 2 | 0.35 | 0.46 | 0.075 | 0.051 | 1.47 | 0.10 | 3600 |
| 3 | 0.32 | 0.47 | 0.089 | 0.068 | 1.31 | 0.09 | 3550 |
| 4 | 0.28 | 0.52 | 0.078 | 0.055 | 1.42 | 0.13 | 3500 |
| 5 | 0.33 | 0.45 | 0.058 | 0.032 | 1.81 | 0.15 | 3300 |
| 6 | 0.28 | 0.50 | 0.148 | 0.078 | 1.90 | 0.18 | 3200 |
| 7 | 0.35 | 0.48 | 0.098 | 0.066 | 1.48 | 0.23 | 3000 |
| 8 | 0.26 | 0.43 | 0.087 | 0.065 | 1.34 | 0.22 | 2900 |

TABLE 4-continued

| Sample No. | Interface roughness (μm) Rake face | Interface roughness (μm) Flank face | Honing (mm) Rake face side L1 | Honing (mm) Flank face side L2 | L1/L2 | Cutting performance Flank face wear width Vb (mm) | Cutting performance Number of times impacted (times) |
|---|---|---|---|---|---|---|---|
| 9  | 0.35 | 0.35 | 0.075 | 0.059 | 1.27 | 0.26 | 3000 |
| 10 | 0.48 | 0.35 | 0.112 | 0.090 | 1.24 | 0.26 | 3000 |
| 11 | 0.42 | 0.25 | 0.075 | 0.075 | 1.00 | 0.19 | 2850 |
| 12 | 0.42 | 0.35 | 0.058 | 0.078 | 0.74 | 0.20 | 2800 |
| 13 | 0.33 | 0.56 | 0.054 | 0.027 | 2.00 | 0.19 | 2700 |
| 14 | 0.44 | 0.36 | 0.090 | 0.048 | 1.88 | 0.33 | 2600 |
| 15 | 0.40 | 0.38 | 0.078 | 0.055 | 1.42 | 0.45 | 2300 |
| 16 | 0.43 | 0.27 | 0.059 | 0.045 | 1.31 | 0.33 | 2500 |

In Tables 1 to 4, in sample No. 14, the ratio (Tcf(104)/Tcf(012)) is equal to the ratio (Tcr(104)/Tcr(012)), and in sample Nos. 15 and 16, the ratio (Tcf(104)/Tcf(012)) is smaller than the ratio (Tcr(104)/Tcr(012)). In all of sample Nos. 14, 15, and 16, the progression of wear was rapid, and the aluminum oxide layer peeled easily due to impact.

On the other hand, in sample Nos. 1 to 13, in which the ratio (Tcf(104)/Tcf(012)) was larger than the ratio (Tcr(104)/Tcr(012)), flank face wear was decreased under continuous cutting conditions and the number of times impacted was high under intermittent cutting conditions. In particular, in sample Nos. 1 to 7, 9, and 11 to 13, in which Tcf(104) was higher than Tcf(012) and Tcr(104) was lower than Tcr(012), the flank face wear width was smaller than that of samples Nos. 8 and 10. Additionally, in sample Nos. 1 to 6 and 11 to 13, in which the maximum peak of the aluminum oxide layer on the flank face is If(006) or If(104) and the maximum peak of the aluminum oxide layer on the rake face is Ir(006) or Ir(012), the flank face wear width was particularly small.

REFERENCE SIGNS LIST

1 Cutting tool
2 Rake face
3 Flank face
4 Cutting edge
5 Substrate
6 Coating layer
7 Bottom layer
8 Titanium carbonitride layer
8a MT-titanium carbonitride layer
8b HT-titanium carbonitride layer
9 Intermediate layer
9a Lower intermediate layer
9b Upper intermediate layer
10 Aluminum oxide layer
11 Surface layer
15 Screw hole

What is claimed is:

1. A coated tool comprising:
a first surface;
a second surface adjacent to the first surface;
a cutting edge located on at least a portion of a ridge between the first surface and the second surface;
a substrate; and
a coating layer located on the substrate, the coating layer comprising a titanium carbonitride layer and an aluminum oxide layer having an α-type crystalline structure, and the titanium carbonitride layer being located nearer to the substrate than the aluminum oxide layer; wherein when a value represented by the following equation is taken to be an orientation factor Tc(hkl) on the basis of peaks of the aluminum oxide layer analyzed by X-ray diffraction analysis,
a ratio (Tcf(104)/Tcf(012)) of orientation factors Tcf(104) to Tcf(012) of the coating layer on the second surface is higher than a ratio (Tcr(104)/Tcr(012)) of orientation factors Tcr(104) to Tcr(012) of the coating layer on the first surface:

$$Tc(hkl)=\{I(hkl)/I_0(hkl)\}/[(1/7)\times\Sigma\{I(HKL)/I_0(HKL)\}]$$

where (HKL) represents (012), (104), (110), (006), (113), (024), and (116) crystal planes, each of I(HKL) and I(hkl) represents a peak intensity of a peak attributed to respective crystal planes detected in X-ray diffraction analysis of the aluminum oxide layer, and each of $I_0$(HKL) and $I_0$(hkl) represents a standard diffraction intensity of respective crystal planes listed on JCPDS card no. 43-1484.

2. The coated tool according to claim 1, wherein the Tcf(104) is higher than the Tcf(012), and the Tcr(104) is lower than the Tcr(012).

3. The coated tool according to claim 1, wherein,
among peaks of the aluminum oxide layer on the coating layer on the second face, a peak intensity If(006) of a peak attributed to a (006) plane or a peak intensity If(104) of a peak attributed to a (104) plane is the highest, and,
among peaks of the aluminum oxide layer on the coating layer on the first surface, a peak intensity Ir(006) of a peak attributed to a (006) plane or a peak intensity Ir(012) of a peak attributed to a (012) plane is the highest.

4. The coated tool according to claim 1, wherein
the cutting edge has a curved surface shape, and
a ratio (L1/L2) of a width L1 of the curved surface when the first surface is viewed head-on to a width L2 of the curved surface when the second surface is viewed head-on is from 1.3 to 2.0.

5. The coated tool according to claim 4, wherein the width L2 is viewed head-on is from 0.030 to 0.080 mm.

6. The coated tool according to claim 1, wherein an interface roughness of a surface of the substrate corresponding to the first surface is smaller than an interface roughness of a surface of the substrate corresponding to the second surface.

7. The coated tool according to claim 1, wherein the first surface is a rake face, and the second surface is a flank face.

8. A coated tool comprising:
a substrate comprising a top surface and a side surface; and
a coating layer located on the substrate, and comprising:
  a first layer containing titanium carbonitride; and
  a second layer containing aluminum oxide, wherein the first layer is located between the substrate and the second layer,
wherein, when a value represented by the following equation is taken to be an orientation factor Tc(hkl) on the basis of peaks of the aluminum oxide layer analyzed by X-ray diffraction analysis,
a ratio (Tcf(104)/Tcf(012)) of orientation factors Tcf(104) to Tcf(012) of the coating layer on the side surface is higher than a ratio (Tcr(104)/Tcr(012)) of orientation factors Tcr(104) to Tcr(012) of the coating layer on the top surface:

$$\text{Orientation factor } Tc(hkl) = I(hkl)/I_0(hkl)/[(1/7) \times \Sigma\{I(HKL)/I_0(HKL)\}]$$

where (HKL) represents (012), (104), (110), (006), (113), (024), and (116) crystal planes, each of I(HKL) and I(hkl) represents a peak intensity of a peak attributed to respective crystal planes detected in X-ray diffraction analysis of the aluminum oxide layer, and each of $I_0$(HKL) and $I_0$(hkl) represents a standard diffraction intensity of respective crystal planes listed on JCPDS card no. 43-1484.

* * * * *

UNITED STATES PATENT AND TRADEMARK OFFICE
CERTIFICATE OF CORRECTION

PATENT NO. : 10,744,568 B2  
APPLICATION NO. : 15/546784  
DATED : August 18, 2020  
INVENTOR(S) : Kou Ri et al.

Page 1 of 1

It is certified that error appears in the above-identified patent and that said Letters Patent is hereby corrected as shown below:

In the Claims

Column 15, Line 18-19, Claim 8: change 'Orientation factor Tc(hkl) = I(hkl)/I0(hkl)/[(1/7) × Σ {I(HKL)/I0 (HKL)}]' to -- Orientation factor Tc(hkl) = {I(hkl)/I0(hkl)}/[(1/7) × Σ {I(HKL)/I0 (HKL)}] --.

Signed and Sealed this  
Second Day of February, 2021

Drew Hirshfeld  
*Performing the Functions and Duties of the*  
*Under Secretary of Commerce for Intellectual Property and*  
*Director of the United States Patent and Trademark Office*